United States Patent
Russell et al.

(10) Patent No.: US 7,846,764 B2
(45) Date of Patent: Dec. 7, 2010

(54) SEMICONDUCTOR FILM COMPRISING DISCRETE DOMAINS OF AN ORGANIC SEMICONDUCTOR AND A METHOD OF ITS FABRICATION

(75) Inventors: David Russell, Cambridge (GB);
Thomas Kugler, Cambridge (GB);
Christopher Newsome, St. Ives (GB);
Shunpu Li, Cambridge (GB)

(73) Assignee: Seiko Epson Corporation, Tokyo (JP)

( * ) Notice: Subject to any disclaimer, the term of this patent is extended or adjusted under 35 U.S.C. 154(b) by 837 days.

(21) Appl. No.: 11/517,449

(22) Filed: Sep. 8, 2006

(65) Prior Publication Data
US 2008/0035915 A1    Feb. 14, 2008

(30) Foreign Application Priority Data
Sep. 20, 2005    (GB) .................................. 0519184.6

(51) Int. Cl.
*H01L 51/40*    (2006.01)
*C30B 29/54*    (2006.01)
(52) U.S. Cl. .................. 438/99; 257/E51.024; 117/925
(58) Field of Classification Search .................. 257/40, 257/E51.001–E51.052; 438/99; 117/68, 117/70, 925–927
See application file for complete search history.

(56) References Cited

U.S. PATENT DOCUMENTS

| 5,500,537 | A | * | 3/1996 | Tsumura et al. | ................ | 257/40 |
| 6,066,420 | A | * | 5/2000 | Ohtsu et al. | .................... | 430/31 |
| 6,910,933 | B1 | * | 6/2005 | Matsuo et al. | ................. | 445/24 |

(Continued)

FOREIGN PATENT DOCUMENTS

CN    1471182 A    1/2004

(Continued)

OTHER PUBLICATIONS

Jian Ye, Hong-Zheng Chen, Mang Wang. "Preparation and Characterization of Chloroindium Phthlacyanine nanoparticles from Complexation-Mediated Solubilization." Journal of Materials Science, vol. 38 (2003); p. 4021-4025.*

(Continued)

*Primary Examiner*—Matthew W Such
(74) *Attorney, Agent, or Firm*—Oliff & Berridge, PLC

(57) ABSTRACT

According to a first aspect, the present invention provides a method for forming a semiconductor film comprising a first step of providing a solution comprising a first organic semiconductor and a second organic semiconductor on a surface of a substrate. The solution is then dried to form the semiconductor film so that it comprises discrete domains of the first organic semiconductor in a matrix of the second organic semiconductor which electrically connects adjacent domains of the first organic semiconductor. The first and second semiconductors are of the same conductivity type. The mobility of charge carriers in the domains of the first organic semiconductor is higher than the mobility of charge carriers in the matrix of the second organic semiconductor. In alternative aspects, the present invention provides methods forming similar semiconductor film products but in which a solution of the first organic semiconductor is deposited separately from the second organic semiconductor and dried to form discrete domains. The present invention also provides a semiconductor film such as produced by the above methods in which both the first and second organic semiconductors are thiophenes.

16 Claims, 2 Drawing Sheets

U.S. PATENT DOCUMENTS

Figure 1:
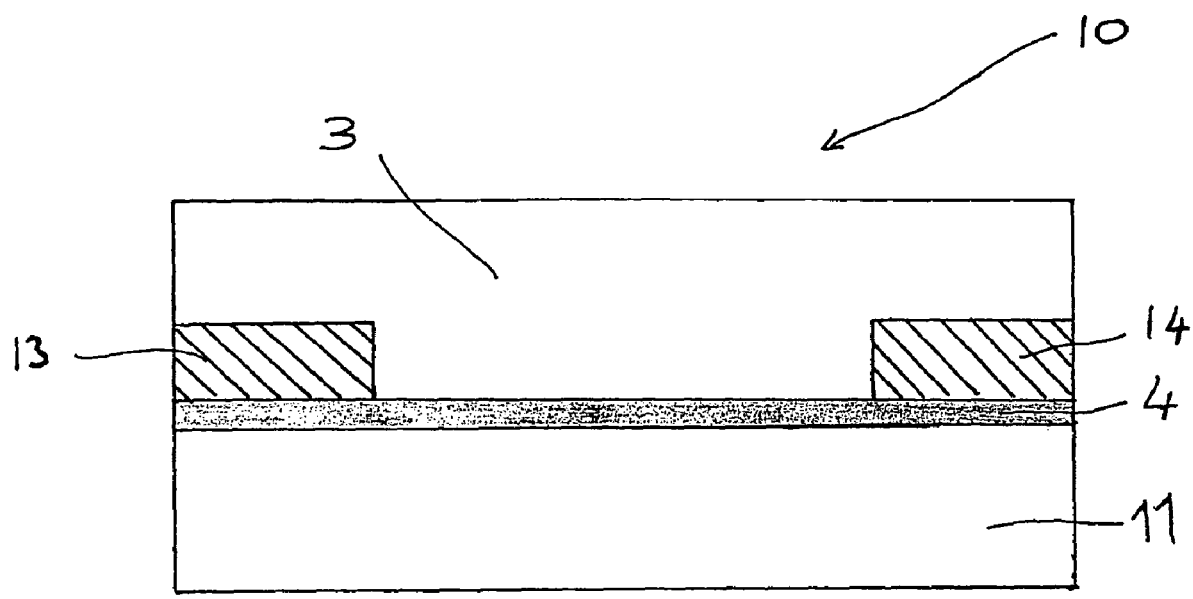

| | | | |
|---|---|---|---|
| 6,963,080 B2* | 11/2005 | Afzali-Ardakani et al. | 257/40 |
| 7,262,264 B2* | 8/2007 | Werner et al. | 528/377 |
| 7,268,363 B2* | 9/2007 | Lenhard et al. | 257/40 |
| 7,517,719 B2* | 4/2009 | Kugler et al. | 438/99 |
| 7,550,173 B2* | 6/2009 | Seo et al. | 427/66 |
| 2003/0015960 A1* | 1/2003 | Seo et al. | 313/504 |
| 2003/0085397 A1* | 5/2003 | Geens et al. | 257/40 |
| 2004/0077122 A1* | 4/2004 | Wu et al. | 438/99 |
| 2004/0155239 A1* | 8/2004 | Yan et al. | 257/40 |
| 2005/0019592 A1* | 1/2005 | Bai et al. | 428/461 |
| 2005/0104060 A1* | 5/2005 | Halik et al. | 257/40 |
| 2005/0127354 A1* | 6/2005 | Hanna et al. | 257/40 |
| 2005/0148179 A1* | 7/2005 | Hirai et al. | 438/689 |
| 2005/0199181 A1* | 9/2005 | Headrick | 117/5 |
| 2007/0034860 A1* | 2/2007 | Nakamura | 257/40 |

FOREIGN PATENT DOCUMENTS

| | | | |
|---|---|---|---|
| JP | 2004158710 A | 3/2004 | |
| JP | A 2004-158710 | 6/2004 | |
| JP | A 2005-064489 | 3/2005 | |
| JP | 2005064489 A | 10/2005 | |

OTHER PUBLICATIONS

Joseph Shinar, ed. Organic Light Emitting Devices: A Survey. Springer-Verlag Press: New York (2004), p. 15.*

Kim, J.-S., et al. "Phase Separation in Polyfluorene-Based Conjugated Polymer Blends: Lateral and Vertical Analysis of Blend Spin-Cast Thin Films." Macromol., vol. 37 (2004): pp. 2861-2871.*

Higgins, A.M., et al. "Surface Segregation and Self-Stratification in Blends of Spin-Cast Polyfluorene Derivatives." J. Phys. Condens. Matter, vol. 17 (2005): pp. 1319-1328.*

Yamamoto, T., et al. "Extensive Studies on pi-Stacking of Poly(3-alkylthiophene-2,5-diyl)s and Poly(4-alkylthiazole-2,5-diyl)s by Optical Spectroscopy, NMR Analysis, Light Scattering Analysis, and X-ray Crystallography." J. Am. Chem. Soc., vol. 120 (1998): pp. 2047-2058.*

Chinese Office Action, mailed Oct. 9, 2009 with English-language translation.

* cited by examiner

SEMICONDUCTOR FILM COMPRISING DISCRETE DOMAINS OF AN ORGANIC SEMICONDUCTOR AND A METHOD OF ITS FABRICATION

This invention relates to the fabrication of a semiconductor film which comprises discrete domains of an organic semiconductor. It particularly relates to such a semiconductor film in which charge carriers have enhanced mobility.

It is known in the art to manufacture thin film transistors comprising semiconductor films by vacuum depositing a semiconductor material onto a substrate. The intrinsic mobilities of the charge carriers in inorganic semiconductor films formed in this way are as high as 1000 $cm^2/Vs$. Vacuum deposition is however an expensive production technique because it requires the use of specialised apparatus and ultra-clean processing conditions. Production methods requiring simpler fabrication techniques are therefore sought.

Various organic semiconductors, including derivatives of pentacene, are currently being developed which are capable of being deposited from solution. These derivatives have the advantage that they can be deposited as a liquid by spin-coating or by printing technologies such as projection in the form of liquid droplets, i.e. by ink-jet printing. These deposition techniques are much cheaper to carry out than vacuum deposition. It is expected that organic semiconductors that can be deposited from solution may provide a route to significantly cheaper methods of fabricating semiconductor devices.

The gap between the source and drain electrodes of a thin-film transistor is typically 1-10 μm. The gap is 30 bridged in the transistor by a film of semiconductor. It is known to be advantageous to form this semiconductor film from as large domains, such as crystals, as possible as the mobility of charge carriers within such domains is relatively high. On the other hand, the mobility of the charge carriers between the domains is low. Unfortunately, it is difficult to fabricate a single domain which bridges the source-drain gap. As a consequence charge carriers passing between the source and drain electrodes have to pass through at least several domains and therefore also across several domain boundaries. These domain boundaries significantly reduce the mobility of charge carriers through the film as a whole. Further, if the domains do not contact one another, it may be that there is no route for charge carriers to pass between the source and drain electrodes at all. An additional problem is that discrete domains, such as crystals, may not adhere well to the substrate between the electrodes and so may become dislodged and lost.

As a consequence of these problems, there are a number of organic semiconductors which have a relatively high intrinsic charge carrier mobility but from which it is difficult to form satisfactory semiconductor films. This is because these organic semiconductors form crystals or some other form of discrete domain on deposition due for instance to their solutions de-wetting on the substrate. What is required is to somehow fabricate semiconductor films from these semiconductors which exhibit the intrinsic high charge carrier mobility of the discrete domains across the film as a whole.

Ink-jet printing techniques are being developed in which the components of a thin film transistor are projected onto a substrate in the form of liquid droplets by means of an adapted ink-jet printing head. Ink-jet printing is an attractive printing technology because it is relatively cheap and capable of producing high resolution patterns of the printed liquid. However, ink-jet printing has the inherent disadvantage that present systems cannot be used to deposit suspensions which contain particles whose longest dimension is much above 1 μm. This is because such particles tend to block the nozzle of the ink-jet which is self-evidently unacceptable. Therefore this technology is unsuited to deposit suspensions of semi-conductor crystals having a longest dimension much above 1 μm. Unfortunately, it is just such large crystals which would be preferred because they give rise to semiconductor films having increased mobility of charge carriers by minimising the number of domain boundaries which the charge carriers must traverse between the source and drain electrodes.

In this specification, the expression "bulk electrical conductance" means the electrical conductance of a film comprising discrete domains of organic semiconductor with or without binder material being present between the domains in contrast to the intrinsic electrical conductance possessed by a single semiconducting domain or the binder material; the expression "bulk charge carrier mobility" means the mobility of charge carriers in a film comprising discrete domains of organic semiconductor with or without binder material being present between the domains in contrast to the intrinsic mobility of charge carriers in a single domain of organic semiconductor or in the binder material; and the term "matrix" means any relatively fine-grained or amorphous material in which coarser domains such as crystals (which are not themselves part of the matrix) are embedded or at least held.

It is therefore an object of the present invention to provide a method for fabricating a semiconductor film from a solution comprising an organic semiconductor which possesses high intrinsic charge carrier mobility but which on its own is incapable of being solution deposited to reliably form a continuous film, such that the mobility of charge carriers in the film is sufficient to allow the film to be used as a component of a thin film transistor or other high performance electrical device It is a further object of the present invention to provide a semiconductor film from such an organic semiconductor through which charge carriers have sufficient mobility to allow the film to be used as a component of a thin-film transistor or other high performance electrical device.

According to a first aspect, the present invention provides a method for forming a semiconductor film comprising the steps of:
 (i) providing a solution comprising a first organic semiconductor and a second organic semiconductor, or a precursor of the latter, on a surface of a substrate; and
 (ii) drying the solution to form the semiconductor film which comprises discrete domains of the first organic semiconductor in a matrix of the second organic semiconductor which electrically connects adjacent domains of the first organic semiconductor, the first and second semiconductors being of the same conductivity type, the mobility of charge carriers in the domains of the first organic semiconductor being higher than the mobility of charge carriers in the matrix of the second organic semiconductor.

In this first aspect, it is preferred that the method should further comprise the step of dissolving both the first and second organic semiconductors in a common solvent and then depositing the resulting solution on the surface of the substrate to provide the solution according to step (i) above. In this case, it is preferred that the weight ratio of the first organic semiconductor to the second organic semiconductor in the solution is 0.35-2.0:1.0.

Using a common solvent to dissolve both the first and second organic semiconductors is preferable from the point of view of process efficiency as this permits the simultaneous deposition of both the first and second organic semiconductors. Otherwise, two separate deposition steps would be required. Obviously this requires a solvent to be identified capable of dissolving both the first and second organic semiconductors. As for the relative weight ratio of the first and second organic semiconductors in the solution, this should in principle include as much of the first semiconductor as possible whilst ensuring that sufficient of the second semiconductor is present to form the matrix. The upper limit is of course constrained by the solubility of the first organic semiconductor in the selected solvent.

As an alternative, the first and second organic semiconductors may be deposited as separate solutions on the surface of the substrate successively, in either order, the solutions mixing on the surface to provide the solution according to step (i) above. Thus in this case the solution of the first organic semiconductor may be deposited first followed by the solution of the second; alternatively, the solution of the second organic semiconductor may be deposited first followed by deposition of the solution comprising the first organic semiconductor. In either case, the two solutions mix on the surface of the substrate in order to provide the solution according to step (i) of the first aspect of the present invention.

This embodiment is preferred for instance if it is difficult to identify a common solvent in which both the first and second organic semiconductors can be simultaneously dissolved.

According to a second aspect, the present invention provides a method for forming a semiconductor film comprising the steps of:

(i) providing a solution comprising a first organic semiconductor on a surface of a substrate;
(ii) drying the solution to form discrete domains of the first organic semiconductor on the surface;
(iii) depositing a solution of a second organic semiconductor, or a precursor thereof, over the domains of the first organic semiconductor, the second organic semiconductor being of the same conductivity type as the first; and
(iv) drying the solution of the second organic semiconductor to form the semiconductor film comprising the domains of the first organic semiconductor in a matrix of the second organic semiconductor which electrically connects adjacent domains of the first organic semiconductor;

the mobility of charge carriers in the domains of the first organic semiconductor being higher than the mobility of charge carriers in the matrix of the second organic semiconductor.

According to a third aspect, there is provided a method for forming a semiconductor film comprising the steps of:

(i) depositing a solution of a first organic semiconductor on a preformed film of a second organic semiconductor, the first and second organic semiconductors being of the same conductivity type; and
(ii) drying the solution of the first organic semiconductor to form the semiconductor film comprising discrete domains of the first organic semiconductor in a matrix of the second organic semiconductor which electrically connects adjacent domains of the first organic semiconductor;

the mobility of charge carriers in the domains of the first organic semiconductor being higher than the mobility of charge carriers in the matrix of the second organic semiconductor.

According to the first-third aspects of the present invention, a semiconductor film can be fabricated having a relatively high bulk charge carrier mobility from an organic semiconductor which is incapable of being solution processed on its own to form reliable continuous films. The methods of the present invention further have the advantage of not needing an expensive vacuum deposition step. The resulting films have a high bulk charge carrier mobility due to the discrete domains of the first semiconductor being held or embedded in the matrix of the second semiconductor. This matrix creates electrical connections between the adjacent domains of the first semiconductor and also between the domains and the electrodes of the semiconductor device thus increasing the mobility of the charge carriers into and through the film. The matrix of the second organic semiconductor also provides the advantage of helping to adhere the discrete domains of the first organic semiconductor to the substrate and also possibly to the electrodes of the semiconductor device.

The first and second organic semiconductors are formed from different materials, the first semiconductor having a higher intrinsic charge carrier mobility than the second. This ensures that the bulk charge carrier mobility of the film as a whole is large insofar as charge carriers are predominantly carried through the film by the discrete domains of the first organic semiconductor. However, the first organic semiconductor is one which on its own is incapable of being solution deposited to form a reliable continuous film because it separates into discrete domains either as crystals or because it de-wets on the surface on which it is deposited.

The first and second semiconductors must have the same conductivity type. This is because otherwise the charge carrying properties of the first organic semiconductor would be compromised by the conduction characteristics of the matrix of the second organic semiconductor.

In the first-third aspects of the present invention, it is preferred that the solution comprising the first semiconductor is provided on the surface of the substrate or preformed semiconductor film by depositing it there by ink-jet printing. As the solvent of the solution is chosen such that the first semiconductor is soluble therein, there is no risk of blockage of the ink-jet nozzles.

Preferably, the volume ratio of the first organic semiconductor domains to the matrix of the second organic semiconductor in the semiconductor film is in the range 25:75-95:5. The volume ratio is selected to ensure that sufficient of the film is formed from the discrete domains to ensure high charge carrier mobility through the film whilst ensuring that there is sufficient of the second organic semiconductor to form the matrix. As the domains have a higher intrinsic charge carrier mobility than that possessed by the semiconductor binder, it is ensured that the bulk charge carrier mobility of the film as a whole is relatively high.

In a preferred embodiment, the discrete domains of the first organic semiconductor are crystals. Crystals of organic semiconductor generally possess higher intrinsic charge carrier mobility than that of a corresponding amorphous body. However, it is difficult to grow individual crystals which are large enough to bridge the source-drain gap of a typical thin-film transistor. Instead, at least several crystals in a chain are required. It will therefore be understood that the advantages of the co-present matrix are firstly that it electrically connects adjacent crystals to each other and secondly that it helps to adhere the crystals to the substrate and electrodes. The invention also has utility when the solution of the first organic semiconductor does not adequately wet the substrate of the substrate so that it forms discrete areas or "puddles" on this surface. On drying, these puddles form discrete domains of the first organic semiconductor which, in the final semiconductor film, are electrically connected by the co-present matrix formed from the second organic semiconductor.

The semiconductor domains of the first organic semiconductor can have a variety of shapes, both regular and irregular. Whatever the shape, each domain has an axis corresponding to a longest dimension. It is preferred that the average of these longest dimensions of the domains of the first organic semiconductor should fall in the range 1-10 µm.

The domains and the binder have the same conductivity type. If this is p-type, the semiconductor domains can be formed from an organic semiconductor such as polythiophene, pentacene, hexabenzocoronene, dibenzo-tetrathiafulvalene (DB-TTF) or dithiophene-tetrathiafulvalene (DT-TTF). Preferably, the first organic semiconductor is dihexylquarterthiophene (QT). Possible p-type organic semiconductors for forming the matrix (or binder) include polyarylamine, a polyfluorene, a copolymer of a thiophene and a fluorene, or a polythiophene, which if the first organic semiconductor is a polythiophene, is structurally different therefrom. Preferably, the second organic semiconductor is poly(3-hexylthiophene) (P3HT).

According to a fourth aspect, the present invention provides a semiconductor film comprising discrete domains of a first thiophene semiconductor in a matrix of a second different thiophene semiconductor binder which electrically connects adjacent domains of the first thiophene semiconductor, the first and second thiophene semiconductors being of the same conductivity type, the mobility of charge carriers in the domains of the first thiophene semiconductor being higher than the mobility of charge carriers in the matrix of the second thiophene semiconductor.

Preferred aspects of the film according to this fourth aspect essentially correspond to those which are described in connection with the first-third aspects above.

It is particularly preferred that both the first and second thiophene semiconductors are p-type polythiophenes.

The semiconductor film formed according to the first-third aspects of the present invention or as provided by the fourth aspect of the present invention may be used as a component of a thin film transistor. For instance, the semiconductor element may be a transistor channel in electrical contact with source and drain electrodes. Alternatively, the semiconductor film may be a component of an organic light emitting diode. Such thin film transistors or organic light emitting diodes are preferably incorporated in an electrical appliance.

Figure 2:
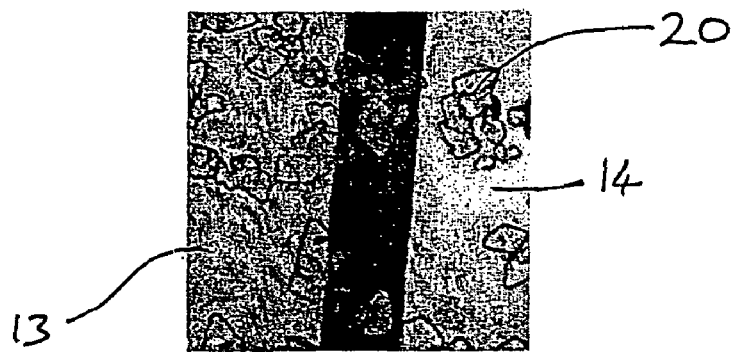
Figure 3:
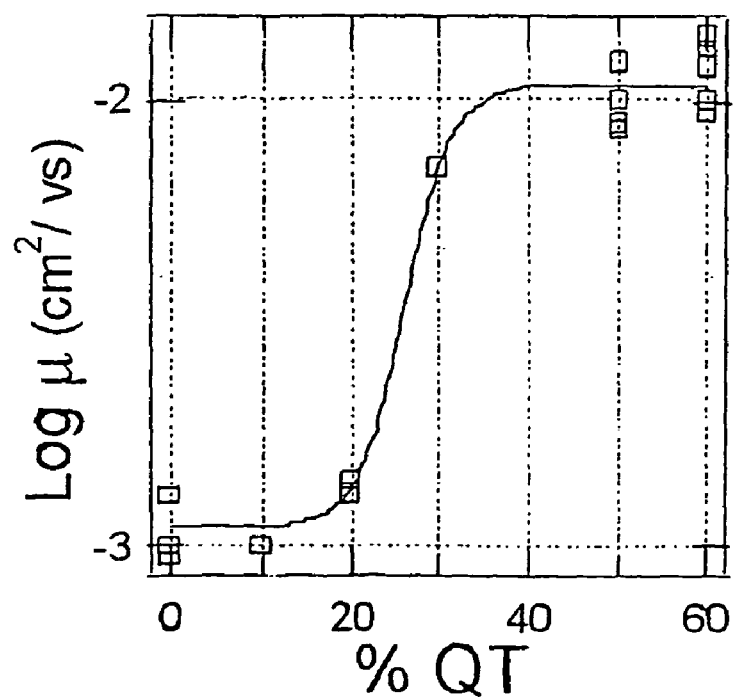

The present invention will now be described in greater detail which will include references to the accompanying drawings, in which like numerals are used throughout, and in which:

FIG. 1 diagrammatically illustrates a cross-section through a thin film transistor including a semiconductor film;

FIG. 2 is a picture taken by optical microscopy of semiconductor crystals formed between source and drain electrodes; and FIG. 3 is a graph illustrating carrier mobility for different ratios of certain first and second organic semiconductors.

The present invention provides methods for fabricating semiconductor films which have a higher bulk charge carrier mobility than prior art films formed by solution-depositing certain organic semiconductors which are incapable on their own of forming reliable continuous films by solution deposition. The method according to the first aspect of the present invention comprises the step of providing a solution, as opposed to a suspension or dispersion, comprising a first organic semiconductor and a second organic semiconductor, or a precursor of the latter, on a surface of a substrate. In this context, the term "solution" means a true solution in which the first organic semiconductor is dissolved in a solvent.

In all aspects of the present invention, "the surface of the substrate" is not limited to the actual surface of for instance a plastic or glass substrate used in the production of a semiconductor element. Rather, "substrate" material in this context is intended to encompass any material on which the semiconductor film is formed which includes surfaces already coated and/or patterned with conductors or semiconductors as part of the fabrication of electronic devices such as thin film transistors.

The solution which comprises the first and second organic semiconductors, or a precursor of the latter, can be provided on the surface of the substrate in a number of ways. It is preferred that both the first and second organic semiconductors are dissolved in a common solvent and the resulting solution then deposited on the surface of the substrate. In this case, the solvent is chosen such that both the first and second organic semiconductors are soluble therein. Possible examples of suitable solvents include benzene, chlorobenzene, dichlorobenzene, toluene and mesitylene. The weight ratio of the first organic semiconductor to the second organic semiconductor in the solution is adjusted preferably to be within the range 0.35-2.0:1.0. This is to ensure that sufficient of each of the first and second organic semiconductors is present in order to form a semiconductor film having relatively high bulk charge carrier mobility.

The absolute amounts of the first and second organic semiconductors dissolved in the solvent depends to some extent upon their respective solubilities. If the solution is to be ink-jet printed onto the substrate, it is important that it should not contain any substantial undissolved particles of either organic semiconductor. This is because such particles have the undesirable tendency to block the nozzles of the ink-jet printer. The maximum amount of the first organic semiconductor may in particular be restricted by its solubility in the solvent.

As an alternative to using a common solvent, it is also possible in the first aspect of the present invention to deposit solutions of the first and second organic semiconductors on the surface of the substrate successively and in either order. The deposited solutions then mix on the surface prior to drying to provide the solution according to step (i) of the first aspect of the present invention. This aspect is less preferred because it requires two separate deposition steps. Nevertheless, it may be appropriate if there is no readily available common solvent which can simultaneously dissolve both the first and second organic semiconductors. According to this aspect, there is no preference as to which of the solutions of the first and second organic semiconductors is deposited first.

In this alternative, the solution of the second semiconductor or precursor thereof may be formed entirely from the semiconductor or its precursor if this is liquid. This can be achieved in some instances by melting the semiconductor or precursor thereof such as the liquid crystalline semiconductor 6-(4'-octylphenyl)-2-dodecyloxynaphthalene (often abbreviated as 8-PNP-O12). It is though preferred to provide the second semiconductor as a solute dissolved in a suitable solvent.

The solution or solutions used to provide the solution in step (i) of the first aspect of the present invention may be deposited by a coating technique such as spin-coating, pad-printing, doctor-blading, screen printing, flexo printing, off-set printing or projection in the form of liquid droplets (sometimes known as "ink-jet printing"). The use of doctor-blading or ink-jet printing allows the semiconductor to be deposited quickly, accurately in the desired area (or areas) and relatively cheaply. Ink-jet printing is particularly advantageous insofar as the deposition apparatus does not directly contact any previously deposited solution or pre-fabricated structures and therefore does not disadvantageously disturb them. Ink-jet printing is also advantageous because it provides a relatively cheap technique for depositing the solution in a pre-determined high resolution pattern.

In the second step of the first aspect of the present invention, the solution of the first organic semiconductor and the second organic semiconductor provided by the first step is dried to form the semiconductor film. This drying step removes the solvent(s) from the deposited solution of the first and second semiconductors. The resulting film comprises discrete domains of the first organic semiconductor in a matrix of the second organic semiconductor. Relatively slow drying of the solvent, if it has a high boiling point, is preferred when the domains are crystals as this tends to produce larger crystals of the first organic semiconductor. Larger crystals are preferred as this results in there being fewer domain boundaries which the charge carriers must traverse as they pass through the semiconductor film. It has been found that if the solution is dried firstly at 60° C. for 20 minutes and then at 120° C. for a further 20 minutes, this ensures efficient removal of the solvent resulting in crystals of the first semiconductor being formed whose average longest dimension can be up to 20 µm, but more typically 1-10 µm.

The semiconductor film provided by the present invention comprises discrete domains of the first organic semiconductor in a matrix of the second organic semiconductor binder which electrically connects adjacent domains of the first organic semiconductor. The binder and domains are of the same conductivity type. Thus these materials are either both n-type or both p-type. The binder must be formed from a different semiconductor material than that forming the domains.

In the case of two semiconductor domains in close proximity to one another and electrically connected by several matrix molecules of the second organic semiconductor, the bulk charge carrier mobility of the system is expected to approach the intrinsic charge carrier mobility of an individual semiconductor domain.

The first organic semiconductor has a higher intrinsic charge carrier mobility than the second semiconductor material. This is because the domains of the first organic semiconductor are largely responsible for the bulk charge carrier mobility of the semiconductor film. If the matrix of the second organic semiconductor had a greater intrinsic charge carrier mobility than the domains of the first organic semiconductor, then no advantage would be achieved by the present invention because in this case the presence of the discrete domains would actually reduce the bulk charge carrier mobility of the semiconductor film.

The second organic semiconductor may be provided in the form of a precursor when it is deposited on the surface of the substrate. After deposition, the precursor is converted by appropriate treatment, such as heating, into the second organic semiconductor. This conversion may be carried out by heating the deposited precursor at 100-200° C. for 1-30 minutes. This is below the sintering temperature of the first organic semiconductor and also does not damage the substrate. One possible precursor which can be used is a pentacene precursor.

In the present invention, the matrix of the second organic semiconductor may be amorphous or formed from relatively small particles compared to the size of the domains of the first organic semiconductor. If the matrix of the second organic semiconductor is particulate, then the average size of its particles is preferably 1-100 nm, more preferably 1-10 nm.

The volume ratio of the domains of the first semiconductor to the matrix of the second semiconductor in the semiconductor film preferably lies in the range 25:75-95:5. A ratio above 25:75 is desirable because the domains of the first semiconductor have a higher intrinsic charge carrier mobility than the mobility of charge carriers in the matrix formed from the second semiconductor. Whilst a relatively high volume ratio approaching 95% for the semiconductor domains is desirable, achieving this is dependent upon the shape of the domains. For example, domains in the shape of flakes may be packed much more tightly than domains which are roughly spherical and so require less matrix material to fill the voids between the domains. Preferably, the volume ratio of domains of the first semiconductor to the matrix of the second semiconductor is 35:65-90:10, most preferably 50:50-80:20.

The domains of the first semiconductor may be generally spherical in shape although this is not so preferred as it does not permit high packing densities to be achieved. It is more preferred that the domains are in the shape of flakes, platelets or needles as such shapes can achieve relatively high packing densities resulting in a semiconductor film having higher bulk electrical conductance compared to a semiconductor film comprising generally spherically shaped domains.

The average of the longest dimension of the domains of the first semiconductor is preferably 1-20 µm, more preferably 2-10 µm and most preferably 2-6 µm. It is preferred that the domains of the first organic semiconductor should be grown to be as large as possible because relatively large domains give rise to a film having greater bulk electrical conductance compared to films formed from smaller domains. This is because, for a given distance, the charge carriers have to pass through fewer grain boundaries. The discrete domains of the first organic semiconductor are preferably crystals.

Regarding the choice of the first and second organic semiconductors, if the semiconductors are both p-type, then the highest energy level of the valence band of the second organic semiconductor binder molecule should be closely aligned to the highest energy level of the valence band of the first organic semiconductor. This requirement is fulfilled for the combination of for example pentacene semiconductor crystals and P3HT as the semiconductor binder molecules. Both these materials have ionisation potentials of approximately 5.0 eV as determined by ultraviolet photoelectron spectroscopy (UPS). Consequently, there is no energy barrier that hinders the movement of holes across the interface between the crystals and the matrix.

Conversely, in the case of n-type semiconductor binder matrix and domains, it is desirable that the lowest energy level of the conduction band of the second semiconductor forming the matrix should be closely aligned to the lowest energy level of the conduction band of the first semiconductor forming the discrete domains.

The conductivity type of the first and second organic semiconductors are both the same. If they are n-type, then the semiconductor domains may be formed for example from buckminsterfullerene ($C_{60}$) and the semiconductor matrix may be formed from poly(benzamidazobenzo phenanthroline), methanofullerene[6,6]-phenyl $C_{61}$ butyric acid methyl ester or poly[2,3-di(p-tolyl)-quinoxaline-5,8-diyl]. For instance, semiconductor domains of buckminsterfullerene ($C_{60}$) may be embedded in a matrix of poly(benzamidazobenzo phenanthroline). The conjugated bond structure of the poly(benzamidazobenzo phenanthroline) can electrically bridge the semiconductor domains which is effective to increase the bulk electrical conductance of the semiconductor film compared to a semiconductor film formed only from the domains of the first organic semiconductor, i.e. not embedded in any semiconducting matrix.

Alternatively, the conductivity type of the semiconductor domains and the semiconductor matrix may be n-type. In this case, the semiconductor domains may be formed from an organic semiconductor, such as a thiophene, particularly a polythiophene, pentacene, hexabenzocoronene, dibenzo-tetrathiafulvalene (DB-TTF) or dithiophene-tetrathiaful-valene (DT-TTF). Preferably, the polythiophene is dihexyl-quarterthiophene (QT).

The p-type semiconductor forming the matrix preferably includes a conjugated bond structure. The presence of such conjugated structures allows electrons to be easily transferred along the length of the molecule and hence in turn between adjacent domains of the first semiconductor. Examples of such a conjugated binder are polyarylamine, a polyfluorene, a copolymer of a thiophene and a fluorene, or a thiophene, particularly a polythiophene, which if the first organic semiconductor is a polythiophene, is structurally different therefrom. Preferably, the second organic semiconductor is a polythiophene such as poly(3-hexylthiophene) (P3HT) whose formula is:

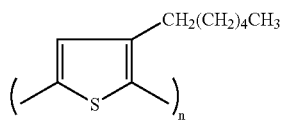

wherein n is an integer from 100-1000.

A particularly preferred combination of semiconductors is that the first organic semiconductor is dihexyl-quarterthiophene and the second organic semiconductor is poly(3-hexylthiophene).

The second organic semiconductor preferably includes moieties which can interact with the semiconductor crystals. Such groups for instance include carboxyl groups, phosphate groups, amine groups, hydroxamate groups, thiol groups and aromatic rings with electron accepting substituents. For instance, P3HT can interact with pentacene crystals via Van der Waal's interactions to link this conjugated binder to the pentacene crystals.

On the other hand, if the semiconductor domains are formed from pentacene or hexabenzocoronene, a polythiophene such as P3HT can be end-capped with phenyl rings bearing one or more electron accepting substituents or a perylene diamine moiety whose structure is:

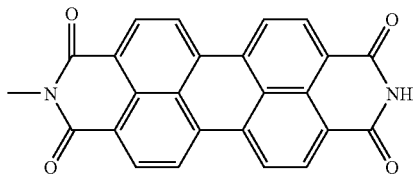

Such cyclic structures are capable of bonding to crystals of p-type organic semiconductors by means of π-π* interactions.

The use of molecules that possess anchoring groups as the second organic semiconductor may effectively result in a dipole layer being formed at the interface between the domains of the first organic semiconductor and semiconductor matrix molecules. Depending on the orientation of the dipole layer, it may reduce the offset between the respective conduction bands or the offset between the respective valence bands. The reduced offsets result in an electrical contact between the semiconductor domains and semiconductor matrix molecules that behaves more ohmically.

It is preferred that the semiconductor film produced according to the first aspect of the present invention has a thickness of 5-200 nm, more preferably 10-100 nm and most preferably 25-50 nm.

In a second aspect, the present invention provides a method for forming a semiconductor film which comprises a first step of providing a solution comprising a first organic semiconductor on a surface of a substrate. This solution is then dried to form discrete domains of the first organic semiconductor on the surface. Subsequently, a solution of a second organic semiconductor, or a precursor thereof, is deposited over the domains of the first organic semiconductor. The second organic semiconductor has the same conductivity type (either "n" or "p") as the first. The solution of the second organic semiconductor is then dried to form the semiconductor film which comprises the domains of the first organic semiconductor in a matrix of the second organic semiconductor which electrically connects adjacent domains of the first organic semiconductor. The mobility of charge carriers in the domains of the first organic semiconductor is higher than the mobility of charge carriers in the matrix of the second organic semiconductor.

In a third aspect, the present invention provides a method for forming a semiconductor film which comprises a first step of depositing a solution of a first organic semiconductor on a preformed film of a second organic semiconductor. The first and second organic semiconductors are of the same conductivity type (either "n" or "p"). The solution of the first organic semiconductor is then dried to form the semiconductor film which comprises discrete domains of the first organic semiconductor in a matrix of the second organic semiconductor which electrically connects adjacent domains of the first organic semiconductor. Again, the mobility of charge carriers and the domains of the first organic semiconductor is higher than the mobility of charge carriers in the matrix of the second organic semiconductor.

Preferably, the solution comprising the first organic semiconductor is deposited on the preformed film by ink-jet printing.

In this third aspect, it is helpful if the second organic semiconductor is at least a little soluble in the solvent used to form the solution of the first organic semiconductor in order that the discrete domains of the first organic semiconductor can embed themselves to some extent in the matrix of the second organic semiconductor. However, this is not essential as the discrete domains of the first organic semiconductor could simply rest on the preformed film of the second organic semiconductor which would have the desired effect of electrically connecting the discrete domains.

The technical features which have been described in connection with the first aspect of the present invention may all generally be adopted in connection with the case of the second and third aspects. Thus the same first and second organic semiconductors may be used together with the same types of solvent and general processing conditions. The principal difference between the second/third and first aspects of the present invention is that in the former domains of the first organic semiconductor are formed by deposition of a solution which does not contain the second organic semiconductor. The advantage of the second and third aspects is that the solvent and drying conditions may be specifically selected to ensure the growth as large domains, particularly crystals, as possible of the first organic semiconductor without this growth process suffering interference from the second organic semiconductor. On the other hand, the disadvantage of these aspects is that two separate deposition steps have to be carried out in registration with one another in order to form the semiconductor film which increases the complexity of the fabrication method as well as its cost.

According to a fourth aspect, the invention provides a semiconductor film comprising discrete domains of a first thiophene semiconductor in a matrix of a second different thiophene semiconductor binder which electrically connects adjacent domains of the first thiophene semiconductor, the first and second thiophene semiconductors being of the same conductivity type, the mobility of charge carriers in the domains of the first thiophene semiconductor being higher than the mobility of charge carriers in the matrix of the second thiophene semiconductor.

In this fourth aspect, it is preferred that both the first and second thiophenes are p-type polythiophenes. Otherwise, the technical features which have been described in connection with the first-third aspects of the present invention may all generally be adopted in connection with this fourth aspect.

It is preferred that the discrete domains of the first thiophene semiconductor are in the form of crystals. These preferably have an average longest dimension of 1-10 µm. Preferably the first thiophene is dihexly-quarterthiophene (QT). It is further more preferred that the second thiophene is poly(3-hexylthiophene) (P3HT).

Turning now to the accompanying drawings, FIG. 1 illustrates a thin film transistor 10. The transistor comprises a doped substrate 11, which also acts as a gate electrode, supporting an insulating layer 4. A source electrode 13 and a drain electrode 14 are supported by the insulating layer 4. This plurality of components corresponds to the "substrate".

A semiconductor film 3 corresponding to the fourth aspect of the invention or formed in accordance with the first, second or third aspects of the present invention is fabricated between the source electrode 13 and the drain electrode 14 to form the thin film transistor 10.

The substrate on which the semiconductor film of the invention is formed may include a plurality of components of a thin film transistor, including a gate electrode, a dielectric layer, a source electrode and drain electrode. the semiconductor film formed according to the invention is particularly suited for forming one or more components of a thin film transistor. Particularly, the semiconductor film may be formed so as to be in electrical contact with the source and drain electrodes of a thin film transistor.

An electrical appliance may include a thin film transistor having included therein a film formed in accordance with the invention. Thin film transistors including a semiconducting film according to the invention are particularly suited for use in displays and other electrical appliances.

Alternatively, the semiconductor film formed by the present invention may be included in an organic light emitting diode. This diode may in turn be included in an electrical appliance.

An example of a film fabrication method according to the first aspect of the present invention will now be described. The resulting semiconductor films are in accordance with the fourth aspect of the present invention. However, it will be understood that other methods of fabrication within the scope of the invention are possible.

EXAMPLE 1

A series of thin film transistors 10 of the type schematically illustrated in FIG. 1 were fabricated in a nitrogen glovebox to avoid oxidative doping of the organic semiconductors. Measurements of the transistor properties were also carried out in such a nitrogen glovebox. In each case, the substrate was formed from a doped silicon substrate 11 bearing a 100 nm thick layer of $SiO_2$ 4 on its surface. On top of this $SiO_2$ layer, source and drain electrodes 13 and 14 were then fabricated by photolithography each comprising a 10 nm thick layer of Cr supporting a 100 nm thick layer of Au. The substrate was then cleaned by subjecting it to an oxygen plasma treatment at 200 W for 5 minutes.

A semiconductor film 3 was then deposited by spin-coating a solution comprising both first and second organic semiconductors in 1,3-dichlorobenzene at 1500 rpm. The first and second organic semiconductors were respectively QT and P3HT which were dissolved in the dichlorobenzene in a total concentration of 10 mg per ml. Films were formed from the following weight ratios of QT to P3HT: 0:100, 10:90, 20:80, 30:70, 50:50 and 60:40. After spin-coating, the semiconductor films were dried at 60° C. for 20 minutes and then at a 120° C. for 20 minutes to ensure sufficient removal of the dichlorobenzene solvent and to grow crystals of the QT.

FIG. 2 is an optical microscope image of the 50:50 weight ration QT:P3HT blend film. The image shows crystals 20 of QT having an average longest dimension of 2-5 µm formed throughout the active layer bridging the source and drain electrodes 13, 14.

FIG. 3 is a graph which plots the carrier mobility as the percentage of QT relative to P3HT increases from 0 to 60%. It will be seen that there is an abrupt increase in carrier mobility as the concentration of QT increases from 20% to 35% by weight. Optical inspection of these films revealed that this improvement is concomitant with the formation of crystals of QT in the semiconductor film.

The invention claimed is:
1. A method for forming a semiconductor film comprising:
 (i) providing a solution comprising a first organic semiconductor and one of a second organic semiconductor and a precursor of the second organic semiconductor on a surface of a substrate, the first organic semiconductor having the same conductivity type as the second organic semiconductor, the first organic semiconductor having a mobility of charge carriers greater than the second organic semiconductor; and
 (ii) drying the solution to form the semiconductor film such that a plurality of discrete domains of the first organic semiconductor is formed in a matrix of the second organic semiconductor, the second organic semiconductor connecting the plurality of discrete domains of the first organic semiconductor,
 wherein the plurality of discrete domains of the first organic semiconductor are crystals having an average longest dimension of 1-10 µm.
2. A method according to claim 1, further comprising the step of dissolving both the first organic semiconductor and the second organic semiconductor in a common solvent and depositing the resulting solution on the surface of the substrate to provide the solution according to step (i).

3. A method according to claim 2, wherein the weight ratio of the first organic semiconductor to the second organic semiconductor in the solution is 0.35-2.0:1.0.

4. A method according to claim 1, comprising depositing separate solutions of (1) the first organic semiconductor and (2) one of the second organic semiconductor and a precursor of the second organic semiconductor on the surface of the substrate successively, in either order, the separate solutions mixing on the surface of the substrate to provide the solution according to step (i).

5. A method for forming a semiconductor film comprising:
(i) providing a solution comprising a first organic semiconductor on a surface of a substrate;
(ii) drying the solution to form a plurality of discrete domains of the first organic semiconductor on the surface of the substrate;
(iii) depositing a solution comprised of one of a second organic semiconductor and a precursor of the second organic semiconductor over the plurality of discrete domains of the first organic semiconductor, the second organic semiconductor having the same conductivity type as the first organic semiconductor; and
(iv) drying the solution of the second organic semiconductor to form the plurality of discrete domains of the first organic semiconductor in a matrix of the second organic semiconductor, the second organic semiconductor connecting the plurality of discrete domains of the first organic semiconductor; and
wherein the first organic semiconductor having a mobility of charge carriers greater than the matrix of the second organic semiconductor,
wherein the plurality of discrete domains of the first organic semiconductor are crystals having an average longest dimension of 1-10 μm.

6. A method according to claim 5, wherein the solution comprising the first organic semiconductor is deposited on the surface of the substrate by ink-jet printing.

7. A method for forming a semiconductor film comprising:
(i) depositing a solution of a first organic semiconductor on a preformed film of a second organic semiconductor, the first organic semiconductor having the same conductivity type as the second organic semiconductor, the first organic semiconductor having a mobility of charge carriers greater than the second organic semiconductor; and
(ii) drying the solution of the first organic semiconductor to form the semiconductor film such that a plurality of discrete domains of the first organic semiconductor is formed in a matrix of the second organic semiconductor, the second organic semiconductor connecting the plurality of discrete domains of the first organic semiconductor;
wherein the plurality of discrete domains of the first organic semiconductor are crystals having an average longest dimension of 1-10 μm.

8. A method according to claim 7, wherein the solution comprising the first organic semiconductor is deposited on the preformed film of the second organic semiconductor by ink jet printing.

9. A method according to claim 7, wherein the second organic semiconductor is deposited in the form of a precursor thereof and the method further comprises the step of heating the deposited precursor to convert it into the second organic semiconductor prior to, or at the same time as, drying the second organic semiconductor to form the matrix.

10. A method according to claim 7, wherein the volume ratio of the plurality of discrete domains of the first organic semiconductor to the matrix of the second organic semiconductor is in the range of 25:75-95:5.

11. A method according to claim 7, wherein the first organic semiconductor and the second organic semiconductor are both p-type.

12. A method according to claim 11, wherein the first organic semiconductor is a polythiophene, pentacene, hexabenzocoronene, dibenzo-tetrathiafulvalene (DB-TTF) or dithiophene-tetrathiafulvalene (DT-TTF).

13. A method according to claim 11, wherein the first organic semiconductor is dihexyl-quarterthiophene (QT).

14. A method according to claim 11, wherein the second organic semiconductor is a polyarylamine, a polyfluorene, a copolymer of a thiophene and a fluorene, or a polythiophene, which if the first organic semiconductor is a polythiophene, is structurally different therefrom.

15. A method according to claim 14, wherein the second organic semiconductor is poly(3-hexylthiophene) (P3HT).

16. A method according to claim 7, wherein the solvent used to prepare solutions of the first organic semiconductor and the second organic semiconductor is benzene, chlorobenzene or dichlorobenzene.

* * * * *